United States Patent
Konkle et al.

(10) Patent No.: US 9,871,073 B1
(45) Date of Patent: Jan. 16, 2018

(54) SCINTILLATOR SEALING FOR SOLID STATE X-RAY DETECTOR

(71) Applicant: General Electric Company, Schenectady, NY (US)

(72) Inventors: Nicholas Konkle, Sussex, WI (US); Biju Jacob, Niskayuna, NY (US); Douglas Albagli, Clifton Park, NY (US); William Andrew Hennessy, Schenectady, NY (US)

(73) Assignee: General Electric Company, Schencectady, NY (US)

( * ) Notice: Subject to any disclaimer, the term of this patent is extended or adjusted under 35 U.S.C. 154(b) by 0 days.

(21) Appl. No.: 15/358,352

(22) Filed: Nov. 22, 2016

(51) Int. Cl.
   *G01T 1/20* (2006.01)
   *H01L 27/146* (2006.01)
   *G01T 1/24* (2006.01)

(52) U.S. Cl.
   CPC ...... *H01L 27/14663* (2013.01); *G01T 1/2018* (2013.01); *G01T 1/24* (2013.01); *H01L 27/14618* (2013.01); *H01L 27/14683* (2013.01)

(58) Field of Classification Search
   CPC .. G01T 1/24; G01T 1/20; G01T 1/202; G01T 1/2018
   See application file for complete search history.

(56) References Cited

U.S. PATENT DOCUMENTS

| | | | |
|---|---|---|---|
| 5,229,613 A * | 7/1993 | Pandelisev | G01T 1/202 250/363.02 |
| 5,274,237 A | 12/1993 | Gallagher et al. | |
| 5,641,984 A | 6/1997 | Aftergut et al. | |
| 6,642,524 B2 | 11/2003 | Vafi et al. | |
| 6,770,885 B2 * | 8/2004 | Eberhard | G01T 1/1642 250/370.01 |
| 6,927,379 B2 | 8/2005 | Hoffman | |
| 7,126,130 B2 | 10/2006 | Hennessy et al. | |

(Continued)

FOREIGN PATENT DOCUMENTS

WO   2008147135 A1   12/2008

OTHER PUBLICATIONS

"Home: PAVE Technology," PAVE Technology Website, Available Online at http://www.pavetechnologyco.com/html/home.html, Available as Early as Dec. 8, 2004, Retrieved Nov. 18, 2016, 2 pages.

(Continued)

*Primary Examiner* — Kiho Kim
(74) *Attorney, Agent, or Firm* — McCoy Russell LLP (57) ABSTRACT

An x-ray detector may comprise: a moisture-impermeable substrate including a non-monolithic conductive portion integrated with a monolithic dielectric portion; a scintillator and an array of CMOS tiles positioned between the scintillator and the substrate; a cover positioned on the substrate and forming a seal therebetween that semi-hermetically encloses the scintillator and the array of CMOS tiles in a covered sealed region; and analog-to-digital electronics conductively coupled to the array of CMOS tiles and to the conductive portion, wherein the conductive portion transmits signals from the covered sealed region to beyond the seal without disrupting a semi-hermeticity of the seal. In this way, sealing of multiply-tiled CMOS image array detectors within a single x-ray detector can be more simply and reliably achieved.

20 Claims, 6 Drawing Sheets

(56) References Cited

U.S. PATENT DOCUMENTS

| | | | |
|---|---|---|---|
| 7,473,903 B2 | 1/2009 | DeJule et al. | |
| 8,415,628 B1* | 4/2013 | Shaw | G21K 4/00 250/361 R |
| 2003/0127600 A1* | 7/2003 | Vafi | G01T 1/2018 250/370.11 |
| 2006/0192087 A1* | 8/2006 | Kuszpet | G01T 1/2928 250/214 R |
| 2006/0231961 A1* | 10/2006 | Shibayama | G01T 1/2018 257/794 |
| 2007/0029670 A1* | 2/2007 | Shibayama | H01L 23/13 257/737 |
| 2007/0114429 A1 | 5/2007 | Bhadare | |
| 2010/0276572 A1* | 11/2010 | Iwabuchi | H04N 5/2253 250/208.1 |
| 2011/0228904 A1* | 9/2011 | Iwakiri | A61B 6/4233 378/62 |
| 2011/0260066 A1* | 10/2011 | Vieux | G01T 1/2018 250/361 R |
| 2014/0252229 A1 | 9/2014 | Kondo | |

OTHER PUBLICATIONS

"PAVE-Flex® Flat Cable Hermetic Seals Product Listing Index," PAVE Technology Website, Available Online at http://www.pavetechnologyco.com/design/flex_productindex.html, Available as Early as Oct. 13, 2005, Retrieved Nov. 18, 2016, 2 pages.

Jacob, B. et al., "Radiation Detector Assembly," U.S. Appl. No. 14/985,739, filed Dec. 31, 20151, 30 pages.

Jacob, B. et al., "Radiation Detector Assembly," U.S. Appl. No. 14/985,785, filed Dec. 31, 2015, 31 pages.

Jacob, B. et al., "Scintillator Sealing for Solid State X-Ray Detector," U.S. Appl. No. 15/354,760, filed Nov. 17, 2016, 48 pages.

Jacob, B. et al., "Scintillator Sealing for Solid State X-Ray Detector," U.S. Appl. No. 15/354,820, filed Nov. 17, 2016, 47 pages.

* cited by examiner

SCINTILLATOR SEALING FOR SOLID STATE X-RAY DETECTOR

FIELD

Embodiments of the subject matter disclosed herein relate to a solid state x-ray detector. Other embodiments relate to a solid state x-ray detector system and methods of assembling an x-ray detector.

BACKGROUND

X-ray detectors commonly utilize scintillator materials to convert x-ray photons into visible-spectrum photons as part of the energy detection process, and solid state electronics to convert the visible light photons into digital signals. These x-ray detectors are sealed from moisture because scintillator materials can have an affinity to absorb moisture, and solid state electronics may corrode in the presence of moisture, both of which can adversely affect the structure of the scintillator and degrade the image quality of the image detector. The evolution of digital x-ray detectors has included the development of CMOS (Complementary Metal Oxide Semiconductor) based digital x-ray detectors. Digital CMOS x-ray detectors can be advantageous because they exhibit higher image resolution while reducing electronic noise as compared to amorphous silicon based x-ray detectors. However, assembly of CMOS x-ray detectors can require tiling multiple sensors into a sensor panel array in order to achieve active image areas large enough for certain radiography applications.

The inventors herein have recognized various issues with multiply-tiled CMOS x-ray detectors. Namely, sealing large multiply-tiled array imager configurations from moisture through conventional sealing techniques, such as forming adhesive and coating sealants on the surfaces of the tiled components and substrates, is more challenging because the surface topology of a multiply-tiled array is much more complex than that for a single tile. For example, multiply-tiled imagers have seams between the tiles and moisture can find its way into the seams. Furthermore, tiled imagers do not have a continuous substrate surface on which a seal can be applied to a cover, rendering it more difficult for coating and thin film type seals to prevent moisture intrusion and degradation of the tiles. Further still, sealing multiply-tiled CMOS x-ray detectors can be more costly and complex because the number of electrical connections for supplying power to and transmitting signals from the x-ray detector is higher and these electrical connections must be provided without compromising the integrity of the seal.

BRIEF DESCRIPTION

In one embodiment, the issues described above may be at least partially addressed by an x-ray detector, comprising: a moisture-impermeable substrate including a non-monolithic conductive portion integrated with a monolithic dielectric portion; a scintillator and an array of CMOS tiles positioned between the scintillator and the substrate; a cover positioned on the substrate and forming a seal therebetween that semi-hermetically encloses the scintillator and the array of CMOS tiles in a covered sealed region; and analog-to-digital electronics conductively coupled to the array of CMOS tiles and to the conductive portion, wherein the conductive portion transmits signals from the covered sealed region to beyond the seal without disrupting a semi-hermeticity of the seal.

In another embodiment, an x-ray detector may comprise: a monolithic substrate comprising a moisture-impermeable and dielectric material; a scintillator and a plurality of CMOS tiles, the plurality of CMOS tiles positioned between the scintillator and the monolithic substrate; a cover positioned on the substrate and forming a seal therebetween that semi-hermetically seals the scintillator and the plurality of CMOS tiles between the cover and the monolithic substrate; and a plurality of conductive connectors coupled to the monolithic substrate, the conductive connectors transmitting signals from the array of CMOS tiles external to the seal without disrupting a semi-hermeticity of the seal.

In another embodiment, a method of assembling an x-ray detector, may comprise: forming a moisture-impermeable substrate by impregnating a monolithic dielectric material with a plurality of non-monolithic conductive structures; positioning an array of CMOS tiles between a scintillator and the moisture-impermeable substrate; attaching a cover to the moisture-impermeable substrate, thereby forming a seal that semi-hermetically seals the scintillator and the array of CMOS tiles therebetween; and transmitting signals from the array of CMOS tiles external to the seal through the plurality of non-monolithic conductive structures without disrupting a semi-hermeticity of the seal.

In this way, a technical effect of sealing of multiply-tiled CMOS image array detectors within a single x-ray detector can be more simply and reliably achieved. Furthermore, electrical connectors are provided for supplying power to or transmitting signals from the CMOS tiles across the seal without compromising the semi-hermeticity of the seal. Further still, x-ray detectors comprising four-side buttable CMOS tiles can be more simply and reliably sealed. Further still, the edge to active area of the x-ray detector can be reduced, thereby decreasing material costs for manufacturing the x-ray detector and the weight of the x-ray detector.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

The following description relates to various embodiments of an x-ray detector, and a method for assembling an x-ray detector.

In one embodiment, the issues described above may be at least partially addressed by an x-ray detector, comprising: a moisture-impermeable substrate including a non-monolithic conductive portion integrated with a monolithic dielectric portion; a scintillator and an array of CMOS tiles positioned between the scintillator and the substrate; a cover positioned on the substrate and forming a seal therebetween that semi-hermetically encloses the scintillator and the array of CMOS tiles in a covered sealed region; and analog-to-digital electronics conductively coupled to the array of CMOS tiles and to the conductive portion, wherein the conductive portion transmits signals from the covered sealed region to beyond the seal without disrupting a semi-hermeticity of the seal.

Figure 1A:
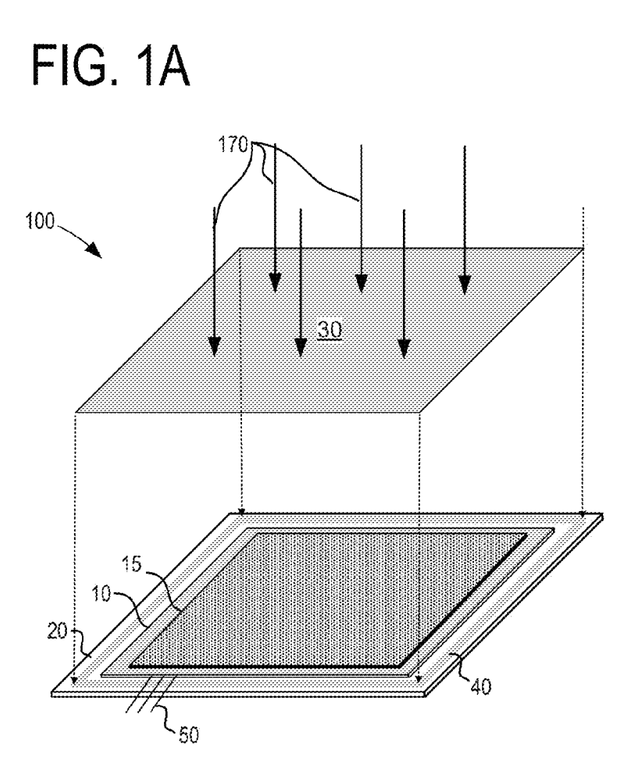
FIGS. 1A and 1B are schematics showing perspective views of an x-ray detector with a seal bonded at the detector substrate surface.
Figure 1B:
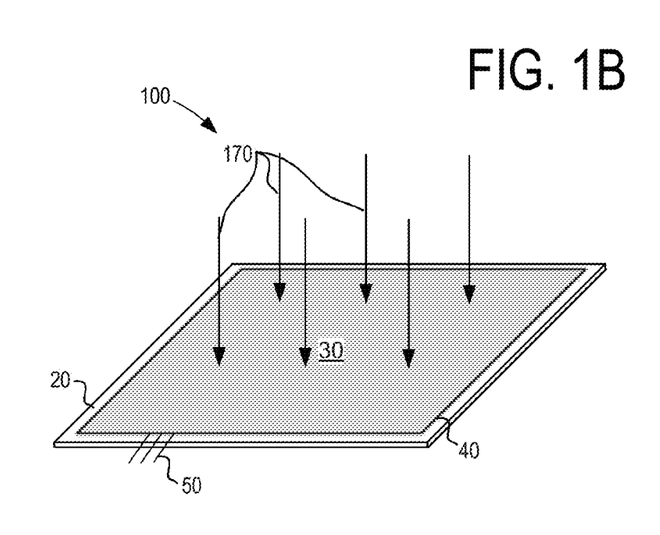

Current methods used to semi-hermetically seal x-ray detectors include using an epoxy sealant to bond a cover to the top layer of the image detector or the image detector substrate, as shown in FIGS. 1A and 1B, for a flat panel x-ray detector 100 having a bonded adhesive seal 40. FIG. 1A illustrates a partially exploded view of the x-ray detector 100 with its cover 30 raised above the x-ray imager, the x-ray imager comprising the scintillator 15 and the image detector 10 layers. Incident x-rays 170 are directed through the cover 30 of the x-ray detector 100 where they are absorbed by the scintillator layer 15 and converted to visible light photons. Some examples of scintillator materials include ionic salts such as cesium iodide (CsI), a hygroscopic, crystalline material, with needle-shaped crystals. CsI crystals are oriented perpendicular to the plane of an adjacent substrate 20 and act as short optical fibers to ensure that visible light photons originating in a crystal preferentially exit the crystal at its end and into an adjacent corresponding photodetector, rather than propagating among adjacent crystals within the CsI layer. The visible light photons exiting the scintillator material are sensed by the image detector 10, which converts and outputs them as digital signals from the detector via connectors 50. The output digital signals are then input into a computer processor, where they are processed into an image for display.

Figure 2A:
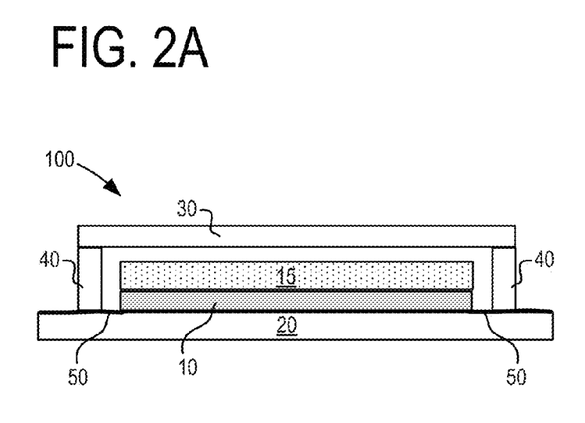
FIGS. 2A and 2B are schematics showing cross-sectional views of an amorphous silicon x-ray detector, and a tiled CMOS x-ray detector, respectively.

Current methods used to seal x-ray detectors vary depending on the type of image sensor. In an amorphous silicon-based imager as shown in FIG. 1, the scintillator (CsI) is usually grown on the glass thin film transistor (TFT) panel substrate 20. The x-ray detector cover 30 is bonded to the glass detector substrate 20 with an epoxy seal 40, providing a semi-hermetic barrier at each edge of the cover 30, as shown in FIG. 1B. Electrical connectors 50 transmit signals to and from an image detector 10 across the seal 40. FIG. 2A depicts a cross-sectional view of the amorphous silicon-based x-ray detector 100. The glass substrate 20 and the detector cover 30 form both halves of the sealed semi-hermetic barrier. Electrical connectors 50, shown as conductive traces in the glass substrate, may be used to supply power from an external power supply to the image detector 20 and transmit signals and data from the image detector 20 to an external computer processor.

Figure 2B:
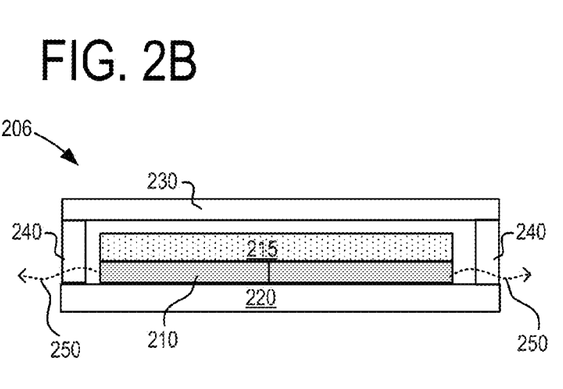

Turning now to FIG. 2B, it illustrates a cross-sectional view of an x-ray detector 206 comprising a multiply-tiled 2×N (2 row by N column) pixel array including CMOS tiles 210. Integrated with each of the pixel array tiles 210 are the electronics associated with each of the CMOS tiles 210, such as electrical connectors 250, and the scintillator 215, so that incident x-rays into each of the pixel array tiles are converted to visible light photons, where they are sensed and received by the image sensors CMOS tiles 210, and the corresponding digital signals are transmitted out of the seal 240 through electrical connectors 250. Each of the array of CMOS tiles 210 may be connected to electrical connectors 250 that transmit the digital signals thereto and therefrom. As described above, the wiring system may include a printed circuit board ("PCB") with additional electronic components such as analog-to-digital electronics conductively coupled to the image sensor 210. Although the tiles of the pixel array are placed as close together as possible, abutting gaps can exist between the tiles. The abutting gaps are vulnerable to trapping moisture that can degrade the scintillators 215 and the electronics inside the sealed volume defined by the cover 230, seal 240, and substrate 220. Abutting gaps are difficult to seal using conventional x-ray detector sealing methods such as thin films, coatings, and bonded sealants.

In a CMOS (Complementary Metal Oxide Semiconductor) based image sensor the scintillator is usually grown on a different substrate (e.g., fiber optic plate). CMOS imagers with large active image areas, such as required for radiography applications, are realized by tiling an array of CMOS sensors into a larger sensor panel. Sealing multiply-tiled CMOS detectors can be achieved by coating the exposed area with organic materials that provide moisture barrier like parylene. Organic materials, such as epoxy adhesives, sealants, and coatings, do not provide hermeticity, but rather offer a low diffusion rate of moisture, the diffusion rate being dependent upon the morphology of the seal, the path length required for moisture to penetrate through diffusion, and the quality of their adhesion to the surfaces they are sealing. In some cases, epoxy or other organic adhesive sealants are provided in addition to the coatings to augment the seal path length, thereby increasing the moisture diffusion time through the seal. Epoxy sealants, adhesives, and organic coatings are thus semi-hermetic seals. Sealing these multiply-tiled array imagers is more challenging as compared to single-tile imagers because the surface topology of a multi tile-array is much more complex. For example, tiled imagers have seams between the tiles and water can find its way into the seams. Furthermore, tiled imagers do not have a continuous substrate surface on which a seal can be applied to a cover, rendering it more difficult for coating and thin film type seals to prevent moisture intrusion and degradation of the tiles.

As shown in FIG. 2B, to facilitate sealing and assembly, the array of CMOS tiles 210 may alternately be enclosed in a superstructure, including a substrate 220 and a cover 230. In this way, the CMOS tiles 210 are sandwiched between the scintillator 215, which are both contained by the cover 230 and the substrate 220. Consequently, sealing the x-ray detector involves sealing the cover 230 to the substrate 220, which is simpler than applying a seal directly to the CMOS tiles 210. A seal 240, such as a curable epoxy or adhesive seal, may be formed upon attaching the cover 230 to the substrate 220, thereby protecting the CMOS tiles 210 and the scintillator 215 from moisture. The substrate 220 and cover 230 may be made from many different types of solids that can serve as semi-hermetic barriers, including aluminum, stainless steel, other metals, polymers, and combinations thereof. In one example, the substrate and/or cover may be constructed of a magnesium alloy, to yield a lighter-weight structure. In another example, the substrate and/or cover may be constructed from a carbon fiber composite coated or laminated with a metal coating or sheet to provide increased seal hermeticity in the vicinity of the seal 240. In some examples, aluminum substrates may be preferable because they are easier to fabricate and aluminum can be easily machined, which may facilitate installation of the electrical connectors 250 without compromising the hermeticity of the seal and superstructure.

Reference will be made below to exemplary embodiments of the inventive subject matter, examples of which are illustrated in the accompanying drawings. Wherever possible, the same reference numerals used throughout the drawings refer to the same or like parts.

Figure 3A:
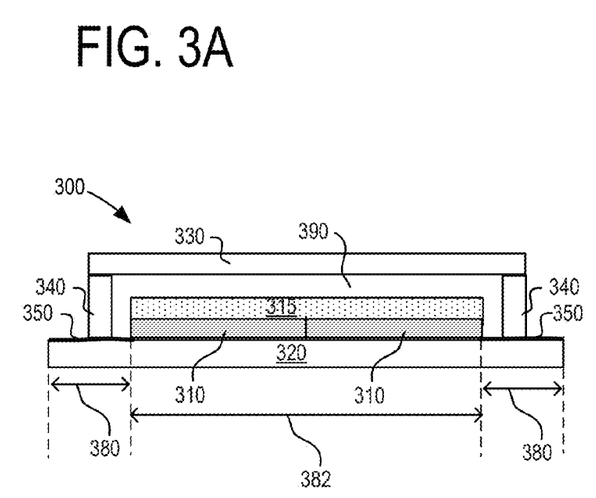
FIGS. 3A, 3B are schematics showing a cross sectional and partial cross-sectional views, respectively of semi-hermetically sealed multiply-tiled CMOS x-ray detectors.

Turning now to FIG. 3A, it illustrates a cross-sectional view of an embodiment of semi-hermetically sealed multiply-tiled CMOS x-ray detector 300, including a seal 340 for sealing a scintillator 315 and image sensor array of CMOS tiles 310 between a cover 330 and a moisture-impermeable substrate 320.

The cover 330 may be a rigid planar structure made from many different types of solids that can serve as semi-hermetic barriers, including aluminum, stainless steel, other metals, polymers, and combinations thereof. A thickness of the cover 330 is thick enough to provide rigidity and support to the x-ray detector 300 when the cover 330 is attached to the moisture-impermeable substrate 320. As shown in FIG. 3A, the planar dimensions of the cover 330 may be greater than the dimensions of the scintillator 315 and greater than the overall dimensions of the array of CMOS tiles 310 so that when the cover 330 is positioned on the moisture-impermeable substrate and attached thereon, the scintillator 315 and the array of CMOS tiles 310 are sealed (with seal 340) therebetween. Furthermore, in some examples, the planar dimensions of the cover 330 may be smaller than the planar dimensions of the moisture-impermeable substrate 320 to accommodate support and positioning of electronic components on the moisture-impermeable substrate 320 external to the seal 340. As shown in FIG. 3A, when the cover 330 is attached to the moisture-impermeable substrate 320, a sealed region may be defined as the volume bound by the interior surfaces of the moisture-impermeable substrate 320, the seal 340, and the cover 330. The sealed region may include a gap 390 or free volume above and/or around the perimeter of the scintillator 315 and/or the array of CMOS tiles 310. In other examples, when the cover 330 is attached and sealed to the moisture-impermeable substrate 320, the seal 340 may be compressed such that the interior surface of the cover 330 is directly adjacent and in contact with the surface of the scintillator 315. Reducing the free volume in the sealed region may enhance the hermeticity of the seal 340 because the risk of moisture intrusion (introduced with humid air into the sealed region) may be reduced. In contrast, having free volume within the sealed region, namely around the perimeter of the array of CMOS tiles 310, may be helpful for spacing and positioning additional components sensors and other electronic components, as further discussed hereinafter. Increasing spacing and reducing crowding of components within the covered sealed region can aid in reduction of heat accumulation, thereby reducing a risk of degradation of the x-ray detector. Because the planar dimensions of the cover 330 are greater than the overall planar dimensions of the array of CMOS tiles 310, the seal 340 formed between a perimeter of the cover 330 and the moisture-impermeable substrate 320 surrounds the array of CMOS tiles 310.

The moisture-impermeable substrate 320 may include a monolithic dielectric material. Example monolithic dielectric materials include glass, ceramic, polymers, metal oxides, and the like. Of these examples, glass or ceramic may be preferred substrates because they are impervious to moisture and thus form hermetic barriers for sealing the x-ray detector. Moisture-impermeable substrate 320 may further comprise a rigid planar solid material so that the array of CMOS tiles 310, the scintillator 315, and other electronic components and connections therebetween can be stably supported during operation of the x-ray detector. The flat and planar aspect of the substrate can facilitate preserving a consistent image quality and resolution between different tiles of the array of CMOS tiles 310. For example, a thickness of the moisture-impermeable substrate 320 may be set to be thick enough to reduce a risk of flexing or bending of the x-ray detector panel during operation. The thickness of the moisture-impermeable substrate 320 may vary based on the type of material chosen (and its inherent material properties) for the substrate. The thickness of the moisture-impermeable substrate 320 may also be set at least in part based on other mechanical properties such as tensile and flexural strength. For example, materials such as glass and ceramic can exhibit lower tensile and flexural strength before failing, so a thickness of a glass or ceramic substrate may be increased accordingly. As a further example, because the image detector includes an array of separate CMOS tiles rather than a one-piece or single-tile image detector, the rigidity and stability of the x-ray detector panel, the stability of the electrical connections between individual tiles of the CMOS tile array, and the stability electrical connections between the CMOS tile array and other electrical components within and external to the seal 340 may largely be imparted to the x-ray detector by the moisture-impermeable substrate.

A flat, planar shape and dimension of the moisture-impermeable substrate 320 may correspond and conform approximately to the shape and dimension of the array of CMOS tiles 310. For example, if the array of CMOS tiles 310 are arranged to form a rectangular array of M×N (e.g., array of CMOS tiles with M rows×N columns; M≠N), the shape of the moisture-impermeable substrate 320 may also be rectangular. In another example, if the array of CMOS tiles 310 are arranged to form a square array of N×N (e.g., array of CMOS tiles with N rows×N columns), the shape of the moisture-impermeable substrate 320 may also be square. Furthermore, the dimensions of the moisture-impermeable substrate 320 may be larger than the overall dimensions of the array of CMOS tiles 310, as shown by a edge region 380 of the moisture-impermeable substrate 320. The edge region 380 allows for accommodation of the seal 340 surrounding the perimeter of the array of CMOS tiles 310, electrical connectors 350 from the array of CMOS tiles 310 across the seal 340, and any electronic components (e.g., analog-to-digital electronics, power sources, sensors, and the like) positioned outside of the perimeter of the array of CMOS tiles 310 or outside the seal 340. In other words, the edge region 380 of the moisture-impermeable substrate 320 may extend beyond the perimeter of the array of CMOS tiles 310 in order to rigidly support one or more of the seal 340, electrical connectors 350, and any electronic components positioned outside the perimeter of the array of CMOS tiles 310 or outside the seal 340.

The x-ray detector 300 comprises a central, active region 382 through which x-rays are incident into the x-ray detector 300, and an edge region 380 around the perimeter of the x-ray detector 300 where x-rays are non-incident. Accordingly, the edge region 380 may form a picture frame layout surrounding the active region 382 of the x-ray detector 300. Dimensions of active region 382 may correspond to the dimensions of the scintillator 315 and/or the array of CMOS tiles 310 of the image sensor so that essentially all incident x-rays are directed through the cover 330 to the scintillator 315 and image sensor 310. In some examples, the perimeter portion of the cover 330 in the edge region 380 may be constructed to be thicker in dimension to provide greater structural strength and rigidity for sealing and attaching the cover 330 to the moisture-impermeable substrate 320, while the interior portion of the cover 330 within active region 382 may be constructed to be thinner in dimension to reduce a risk of interference with the incident x-rays to the x-ray detector 300. Reducing a dimension of the edge region 380 relative to the active region 382 may aid in decreasing a weight of the x-ray detector, and increasing portability of the device.

The seal 340 may be designed to match the shape and geometry and dimension of the sealing surfaces at the perimeter of the underside of the cover 330 and at the moisture-impermeable substrate 320 surrounding the perimeter of the array of CMOS tiles 310. The seal 340 is positioned so that a continuous seal can be formed surrounding the perimeter of the array of CMOS tiles 310. Furthermore, the moisture-impermeable substrate 320 may be the same dimensions as the cover 330, or it may be of a larger dimension on one or more sides, leaving portions of the perimeter of the moisture-impermeable substrate 320 uncovered by the array of CMOS tiles 310, as shown in FIG. 3A. Having portions of the perimeter of the moisture-impermeable substrate 320 uncovered by the cover 330 and/or the array of CMOS tiles 310 may be helpful for spacing and positioning additional components such as sensors, analog-to-digital electronics, and the like, as further discussed hereinafter. Increasing spacing and reducing crowding of components within the x-ray detector can aid in reduction of heat accumulation, thereby reducing a risk of degradation of the x-ray detector.

The seal 340 may comprise a compressible, homogeneous, sealable material such as a rubberized, polymeric, metallic, or non-metallic gasket. Metallic gaskets may provide for a hermetic resealable seal. A non-metallic gasket may provide a semi-hermetic seal, but may advantageously impart a higher resealability to the seal 340. The seal 340 may also comprise an adhesive or curable polymer such as an epoxy. In other examples, the seal 340 may comprise a weld, or be soldered. In further examples, the seal 340 may comprise a metal-to-glass seal or a ceramic-to-metal seal, in cases where the cover 330 comprises a metal and the moisture-impermeable substrate 320 comprises glass to ceramic, respectively. Furthermore, the seal 340 comprises a continuous member that surrounds the perimeter of the array of CMOS tiles 310 between the moisture-impermeable substrate 320 and the cover 330. As such, when the cover 330 is attached to the moisture-impermeable substrate 320, as shown in FIG. 3A, the seal 340 may be compressed and sandwiched between cover 330 and the moisture-impermeable substrate 320, thereby sealing the x-ray detector 300.

The seal provided by the seal 340 may be a hermetic seal or a semi-hermetic seal, the type of seal depending at least partially on the nature of the material of construction of the seal 340. As described above, example materials that can be used for the seal 340 include metallic, non-metallic, and both metallic and non-metallic materials. For example, the seal 340 may be constructed of a metal or a glass, or other ceramic or semi-conductor material. A seal 340 constructed of metal or glass may provide a seal having increased hermeticity relative to non-metallic and non-glass seal materials. Some examples of non-metallic seal materials include nitrile rubber, Neoprene, Viton, butyl rubber, and ethylene propylene diene monomer (EPDM) rubber. The material of the seal 340 may be selected based on the composition of the cover 330 and the moisture-impermeable substrate 320. For example, a seal 340 comprising a glass-to-metal weld may be used to seal a metal cover 330 to a glass substrate, and a seal 340 comprising a ceramic-to-metal seal may be used to seal a metal cover 330 to a ceramic substrate. Alternately, the cover 330 may be soldered to a glass substrate by attaching a metallic solder-adhering mask around the perimeter of the glass substrate corresponding to where the seal 340 is positioned.

The scintillator 315 is positioned on the array of CMOS tiles 310, and the array of CMOS tiles 310 are sandwiched between the scintillator 315 and the moisture-impermeable substrate 320. As described above with reference to FIG. 1, the scintillator 315 absorbs incident x-rays and converts them to visible light photons. Some examples of scintillator materials include ionic salts such as cesium iodide (CsI), a hygroscopic, crystalline material, with needle-shaped crystals. CsI crystals are oriented perpendicular to the plane of the moisture-impermeable substrate 320, and act as short optical fibers to ensure that visible light photons originating in a crystal preferentially exit the crystal at its end and into an adjacent corresponding photodetector, rather than propagating among adjacent crystals within the CsI layer. In some embodiments, the scintillator may also include thin layer coatings thereon which may be provided for corrosion protection, encapsulation, reflecting visible light, as a resistive mask during manufacturing, and the like.

The visible light photons exiting the scintillator 315 are sensed by the image sensor including the array of CMOS tiles 310, which converts and outputs the incident photons as digital signals externally from the x-ray detector 300 via electrical connectors 350. Each of the array of CMOS tiles 310 may comprise one or several pixels. Each pixel has a light photon sensitive area (e.g. a photodiode) that senses visible spectrum photons entering from the scintillator 315. The pixels convert the visible light, based on presence, absence, and intensity into a computer readable digital signal. The output digital signals are then input into a computer processor, where they are processed into an image for display.

To access these data a high speed digital interface connection is provided, with an electrical connector 350 that is conductively coupled to the array of CMOS tiles 310 (or a printed circuit board, PCB, in electrical communication with the image sensor 310). In addition to transmitting digital signals externally from the x-ray detector, electrical connectors 350 transmit the input signals that control and power the array of CMOS tiles 310, scintillator 315, and other components of the x-ray detector 300. In one embodiment, a plurality of conductive electrical connectors 350 may be coupled to the moisture-impermeable substrate 320. In one example, the moisture-impermeable substrate 320 may comprise a monolithic dielectric material so that coupling the plurality of electrical connectors 350 thereto may facilitate transmission and supply of electric signals from and to the array of CMOS tiles 310 across the seal 340. For example, the conductive electrical connectors 350 may include one or a combination of conductive traces, vias, anisotropic conductive film (ACF) bonds, wire bonds, and the like, coupled to one or more surfaces of the moisture-impermeable substrate 320. Various of these electrical connectors 350 may also be used to conductively couple the array of CMOS tiles 310, and other electronic components of the x-ray detector 300 internal to and external to the seal 340.

In another embodiment, the moisture-impermeable substrate 320 may include a non-monolithic conductive portion integrated with a monolithic dielectric portion. The non-monolithic conductive portion may include one or a combination of conductive traces, vias, and ACF bonds. For example, conductive traces may be impregnated within a layer or surface layer of the monolithic dielectric portion of the moisture-impermeable substrate 320. The conductive traces may be non-monolithic in that individual conductive traces may be physically isolated from each other, while conductively coupling one or more electronic components of the x-ray detector 300 across the seal 340. For example, a first conductive trace may be positioned at a surface layer of the monolithic dielectric portion while a second conductive trace may be positioned at a sub-surface layer of the monolithic dielectric portion. In another example, a first conductive trace may electrically connect two electronic components positioned at one end of the x-ray detector 300, while a second conductive trace may electrically connect two electronic components positioned at an opposite end of the x-ray detector 300.

In other examples, the non-monolithic conductive portion may comprise a plurality of vias that span a thickness of the moisture-impermeable substrate 320. In some examples, the vias may span a partial thickness of the moisture-impermeable substrate 320, such as when connecting a conductive trace at a surface layer of the moisture-impermeable substrate 320 with another conductive trace at a subsurface layer of the moisture-impermeable substrate 320. In another example, some of the plurality of vias may span a full thickness of the moisture-impermeable substrate 320, such as when transmitting a signal across the moisture-impermeable substrate 320 into or out of the sealed region. One or more of the plurality of vias may be physically and electrically isolated from other of the plurality of vias, thus forming a non-monolithic conductive portion impregnated in the monolithic dielectric portion of the moisture-impermeable substrate.

The non-monolithic conductive portion may further include ACF bonds impregnated at a surface of the monolithic dielectric portion of the moisture-impermeable substrate 320. In this way, ACF bonds may be used to conductively couple surface-mounted electronic components to electrical connectors positioned at the surface of the moisture-impermeable substrate 320, such as conductive traces, and vias. Furthermore, the non-monolithic conductive portion may comprise a combination of ACF bonds, conductive traces, and vias conductively connected at the surface of the moisture-impermeable substrate 320. As described above, a first portion of conductive connected ACF bonds, conductive traces, and vias may be electrically and physically isolated from a second portion of conductively coupled ACF bonds, conductive traces, and vias, thereby forming a non-monolithic conductive portion of the moisture-impermeable substrate 320. Furthermore, both the first portion and the second portion of conductively connected ACF bonds, conductive traces, and vias may transmit signals from the array of CMOS tiles across the seal 340 and/or the sealed region formed between the cover 330, the seal 340, and the moisture-impermeable substrate 320.

Various sensors may also be positioned inside the covered sealed region of the x-ray detector 300, and may be conductively coupled to one or more of the image sensor array of CMOS tiles 310, the scintillator 315 by way of electrical connectors 350. In one embodiment, the sensors may comprise a moisture or humidity sensor for detecting moisture intrusion into the x-ray detector 300. The moisture sensor may transmit a digital signal to an x-ray detector controller on board a computer processor positioned external to the covered sealed region, and the controller, may execute a responsive controlling action. For example, in response to a moisture level in the covered sealed region of the x-ray detector being greater than a threshold moisture level, the controller may generate an audio and/or visual alarm indication, and may reduce or shut off a power supply to the x-ray detector in order to reduce a risk of degradation to the x-ray detector. In another embodiment, the sensors may include a temperature sensor, and the controller, in response to a temperature being greater than a threshold temperature, may generate an audio and/or visual alarm indication, and may reduce or shut off a power supply to the x-ray detector in order to reduce a risk of degradation to the x-ray detector. As another example, the sensors may include an oxygen sensor to detect intrusion of air or oxygen into the covered sealed region of the x-ray detector, indicating seal integrity degradation. In response to an oxygen level being greater than a threshold oxygen level, the controller may generate an audio and/or visual alarm indication, and may reduce or shut off a power supply to the x-ray detector in order to reduce a risk of degradation to the x-ray detector.

Figure 3B:
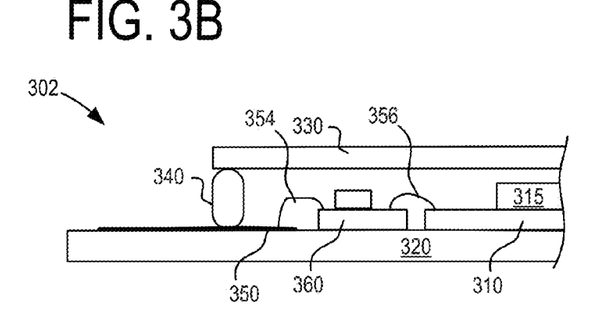

Turning now to FIG. 3B, it illustrates a partial cross-sectional view of an embodiment of a sealed x-ray detector 302 including an array of CMOS tiles 310 positioned between a scintillator 315 and a moisture-impermeable substrate 320. A cover 330 is positioned on top of the moisture-impermeable substrate thereby forming a seal 340 and sealing the array of CMOS tiles 310 and the scintillator 315 therebetween. In the embodiment of FIG. 3B, the seal 340 may comprise an epoxy seal or another polymeric, elastomeric seal. Seal 340 is elastically compressible and deformable so that when the cover 330 is attached to the moisture-impermeable substrate 320, the seal 340 is compressed therebetween, which aids in enhancing a hermeticity of the seal 340. As described above, the moisture-impermeable substrate 320 may include a monolithic dielectric portion composed of glass, ceramic, and the like. As shown in FIG. 3B, the substrate may further comprise electrical connectors 350 coupled to a surface of the moisture-impermeable substrate. The electrical connectors 350 may form a non-monolithic portion of the moisture-impermeable substrate 320 and may be impregnated into the dielectric monolithic portion.

In the example of FIG. 3B, the electrical connectors 350 may comprise a plurality of conductive traces integrated into a surface layer of the moisture-impermeable substrate 320. The conductive traces may be conductively coupled to electrical components internal to the seal such as analog-to-digital electronics 360 through additional electrical connectors such as wire bonds 354 or other types of electrical connectors such as ACF bonds. The analog-to-digital electronics 360 are conductively coupled to the array of CMOS tiles through additional electrical connectors such as wire bonds 356. Accordingly, signals from the array of CMOS tiles may be transmitted through the analog-to-digital electronics 360 and across the seal 340 by way of the electrical connectors 350, 354, and 356. As shown in FIG. 3B, electrical connectors 350 may be routed across the seal 340, including between the seal 340 and a surface of the moisture-impermeable substrate, and including under the seal 340 at a surface or subsurface of the moisture-impermeable substrate 320. As such, the electrical connectors 350 can supply power into the devices inside the covered sealed region and can transmit signals from within the covered sealed region externally to the seal 340 without compromising a hermeticity of the seal 340.

Figure 4A:
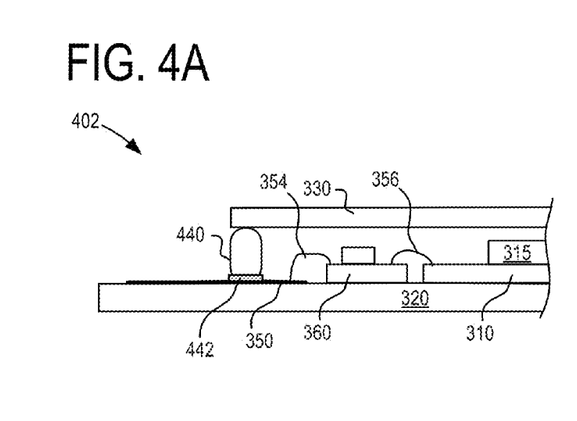
FIGS. 4A-4D, and 5A and 5B are schematics showing partial cross-sectional views of semi-hermetically sealed multiply-tiled CMOS x-ray detectors.
Figure 4B:
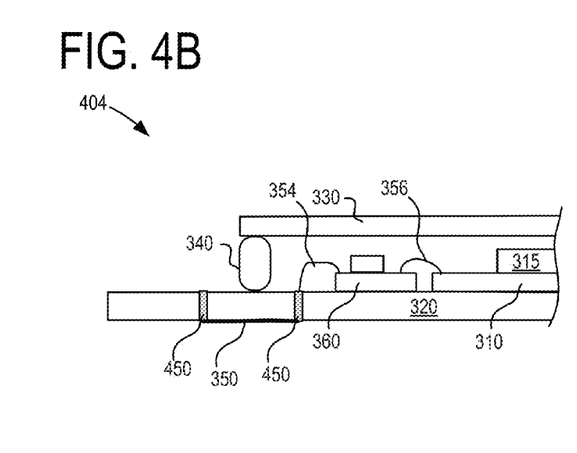
Figure 4C:
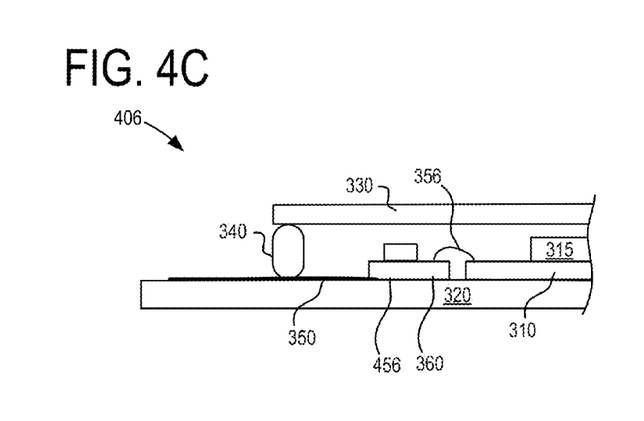

Turning now to FIG. 4A, it illustrates a partial cross-sectional view of an embodiment of a sealed x-ray detector 402 including an array of CMOS tiles 310 positioned between a scintillator 315 and a moisture-impermeable substrate 320. A cover 330 is positioned on top of the moisture-impermeable substrate 320 thereby forming a seal 440 and sealing the array of CMOS tiles 310 and the scintillator 315 therebetween. In the embodiment of FIG. 4A, the seal 440 may comprise a welded seal or a soldered seal. Furthermore, in the case of a seal 440 comprising a conductive material, an insulating mask 442 may be applied between the seal 440 and the moisture-impermeable substrate 320 to prevent short-circuiting of the electrical connectors 350 by the seal 440. In the case of a metal-to-glass or metal-to-ceramic seal, the glass or ceramic may be bonded to a metal oxide layer during the sealing process. As described above, the moisture-impermeable substrate 320 may include a monolithic dielectric portion composed of glass, ceramic, and the like. As shown in FIG. 4B, the substrate may further comprise electrical connectors 350 coupled to a surface of the moisture-impermeable substrate. The electrical connectors 350 may form a non-monolithic portion of the moisture-impermeable substrate 320 and may be impregnated into the dielectric monolithic portion.

In the example of FIG. 4A, the electrical connectors 350 may comprise a plurality of conductive traces integrated into a surface layer of the moisture-impermeable substrate 320. The conductive traces may be conductively coupled to electrical components internal to the seal such as analog-to-digital electronics 360 through additional electrical connectors such as wire bonds 354 or other types of electrical connectors such as ACF bonds. For example, in the embodiment shown in FIG. 4A, the analog-to-digital electronics 360 of x-ray detector 402 are coupled to the conductive trace by way of wire bond 354. In another example, in the embodiment shown in FIG. 4C, the analog-to-digital electronics 360 of x-ray detector 406 are coupled to a conductive trace by way of ACF bond 456 positioned between the moisture-impermeable substrate 320 and the analog-to-digital electronics 360. The analog-to-digital electronics 360 are conductively coupled to the array of CMOS tiles through additional electrical connectors such as wire bonds 356 (as shown in the embodiments of FIGS. 3B, and 4A-4C). Accordingly, signals from the array of CMOS tiles may be transmitted through the analog-to-digital electronics 360 and across the seal 340 by way of the electrical connectors 350, 354, 456, and 356. As shown in FIG. 4A, electrical connectors 350 may be routed across the seal 340, including between the seal 340 and a surface of the moisture-impermeable substrate, and including under the seal 340 and under the insulating mask 442 at a surface or subsurface of the moisture-impermeable substrate 320. As such, the electrical connectors 350 can supply power into the devices inside the covered sealed region and can transmit signals from within the covered sealed region externally to the seal 340 without compromising a hermeticity of the seal 340.

Turning now to FIG. 4B, it illustrates a partial cross-sectional view of an embodiment of a sealed x-ray detector 404 including an array of CMOS tiles 310 positioned between a scintillator 315 and a moisture-impermeable substrate 320. A cover 330 is positioned on top of the moisture-impermeable substrate 320 thereby forming a seal 340 and sealing the array of CMOS tiles 310 and the scintillator 315 therebetween. In the embodiment of FIG. 4B, the seal 340 may comprise an epoxy seal or another polymeric, elastomeric seal that is elastically compressible and deformable so that when the cover 330 is attached to the moisture-impermeable substrate 320, the seal 340 is compressed therebetween, which aids in enhancing a hermeticity of the seal 340. In other examples, the seal 340 may comprise a welded seal or a soldered seal. In the case of a metal-to-glass or metal-to-ceramic seal, the glass or ceramic may be bonded to a metal oxide layer during the sealing process. As described above, the moisture-impermeable substrate 320 may include a monolithic dielectric portion composed of glass, ceramic, and the like. As shown in FIG. 4B, the substrate may further comprise electrical connectors 350 and vias 450 and 452 coupled to a surface of the moisture-impermeable substrate, which may form a non-monolithic portion of the moisture-impermeable substrate 320 and may be impregnated into the dielectric monolithic portion.

The plurality of conductive vias 450 and 452 may further be impregnated into a dielectric monolithic portion of the substrate. Furthermore, a dielectric non-monolithic conductive portion comprising the plurality of conductive vias 450 and 452 may be integrated with a monolithic dielectric portion of the moisture-impermeable substrate 320. As described above, and as shown in FIG. 4B, one or more of the vias 450 and 452 may span a thickness of the moisture-impermeable substrate 320. In other examples, one or more of the vias 450 and 452 may partially span a thickness of the moisture-impermeable substrate 320. Some of the plurality of vias 450 and 452 may be conductively coupled with additional electrical connectors 350, such as conductive traces, as shown in FIG. 4B. Some of the plurality of vias 452 may be conductively coupled to electronic devices positioned on the moisture-impermeable substrate behind the seal 340 and inside the covered sealed region, while other of the plurality of vias may be conductively coupled to electronic components positioned on the moisture-impermeable substrate external to the seal 340 and outside the covered sealed region In some cases, electrical connectors 350 may conductively couple vias 452 positioned on the moisture-impermeable substrate behind the seal 340 and inside the covered sealed region with vias 450 positioned on the moisture-impermeable substrate external to the seal 340 and outside the covered sealed region, as shown in FIG. 4B. In other cases, electrical connectors 350 may conductively couple vias 452 positioned on the moisture-impermeable substrate behind the seal 340 and inside the covered sealed region with other vias 452 positioned inside the covered sealed region, or electrical connectors 350 may conductively couple vias 450 positioned on the moisture-impermeable substrate external to the seal 340 and outside the covered sealed region with other vias 450 positioned outside the covered sealed region.

The electrical connectors 350 may comprise a plurality of conductive traces integrated into a surface layer of the moisture-impermeable substrate 320. The conductive traces may be conductively coupled to electrical components internal to the seal such as analog-to-digital electronics 360 through additional electrical connectors such as vias 452, wire bonds 354, or other types of electrical connectors such as ACF bonds. The analog-to-digital electronics 360 are conductively coupled to the array of CMOS tiles through additional electrical connectors such as wire bonds 356. Accordingly, signals from the array of CMOS tiles may be transmitted through the analog-to-digital electronics 360 and across the seal 340 by way of the electrical connectors 350, 354, 356, including the vias 452 and 450. As shown in FIG. 4B, electrical connectors 350 may be routed across the seal 340, including through the moisture-impermeable substrate 320 by way the vias 450 and 452 and from the active region to the edge region by way of the conductive trace electrical connector 350. As such, the electrical connectors 350 can supply power into the devices inside the covered sealed region and can transmit signals from within the covered sealed region externally to the seal 340 without compromising a hermeticity of the seal 340. Furthermore, by utilizing vias to route signals across the thickness of the moisture-impermeable substrate, rather than underneath or through the seal 340, a hermeticity of the seal 340 may be more reliably preserved.

Figure 4D:
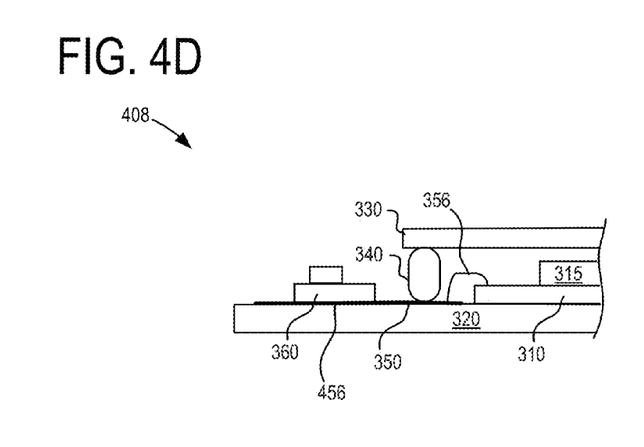

Turning now to FIG. 4D, it illustrates a partial cross-sectional view of an embodiment of a sealed x-ray detector 408 including an array of CMOS tiles 310 positioned between a scintillator 315 and a moisture-impermeable substrate 320. A cover 330 is positioned on top of the moisture-impermeable substrate 320 thereby forming a seal 340 and sealing the array of CMOS tiles 310 and the scintillator 315 therebetween. In the embodiment of FIG. 4D, the seal 340 may comprise an epoxy seal or another polymeric, elastomeric seal that is elastically compressible and deformable so that when the cover 330 is attached to the moisture-impermeable substrate 320, the seal 340 is compressed therebetween, which aids in enhancing a hermeticity of the seal 340. In other examples, the seal 340 may comprise a welded seal or a soldered seal. In the case of a metal-to-glass or metal-to-ceramic seal, the glass or ceramic may be bonded to a metal oxide layer during the sealing process. As described above, the moisture-impermeable substrate 320 may include a monolithic dielectric portion composed of glass, ceramic, and the like. As shown in FIG. 4D, the substrate may further comprise electrical connectors 350 coupled to a surface of the moisture-impermeable substrate. The electrical connectors 350 may form a non-monolithic portion of the moisture-impermeable substrate 320 and may be impregnated into the dielectric monolithic portion.

In the example of FIG. 4D, the electrical connectors 350 may comprise a plurality of conductive traces integrated into a surface layer of the moisture-impermeable substrate 320. The conductive traces may be conductively coupled to electrical components internal to the seal such as such as the array of CMOS tiles 310 and to components positioned external to the seal (and external to the covered sealed region) such as analog-to-digital electronics 360. Positioning the analog-to-digital electronics 360 external to the seal 340 may allow for a more compact active region inside the covered sealed region, and can aid in increasing a hermeticity of the seal by reducing free volume therein. Additional electrical connectors such as wire bonds 354 or other types of electrical connectors such as ACF bonds may also be utilized to couple various electronic components of x-ray detector 408. For example, in the embodiment shown in FIG. 4D, the analog-to-digital electronics 360 of x-ray detector 402 are coupled to the conductive trace by way of ACF bond 456 positioned between the moisture-impermeable substrate 320 and the analog-to-digital electronics 360.

As shown in FIG. 4D, the analog-to-digital electronics 360 are conductively coupled to the array of CMOS tiles through additional electrical connectors such as wire bonds 356. Accordingly, signals from the array of CMOS tiles may be transmitted across the seal 340 by way of the electrical connectors 350, 354, and 456 to the analog-to-digital electronics 360. As shown in FIG. 4D, electrical connectors 350 may be routed across the seal 340, including between the seal 340 and a surface of the moisture-impermeable substrate, and including under the seal 340 at a surface or subsurface of the moisture-impermeable substrate 320. As such, the electrical connectors 350 can supply power into the devices inside the covered sealed region and can transmit signals from within the covered sealed region externally to the seal 340 without compromising a hermeticity of the seal 340.

Figure 5A:
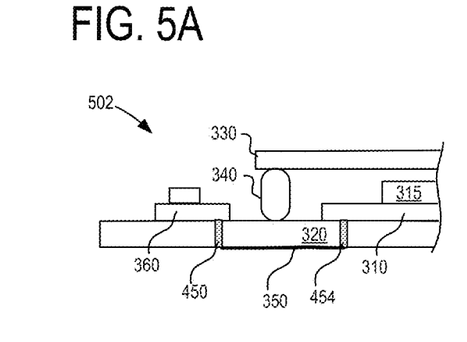

Turning now to FIG. 5A, it illustrates a partial cross-sectional view of an embodiment of a sealed x-ray detector 502 including an array of CMOS tiles 310 positioned between a scintillator 315 and a moisture-impermeable substrate 320. A cover 330 is positioned on top of the moisture-impermeable substrate 320 thereby forming a seal 340 and sealing the array of CMOS tiles 310 and the scintillator 315 therebetween. In the embodiment of FIG. 5A, the seal 340 may comprise an epoxy seal or another polymeric, elastomeric seal that is elastically compressible and deformable so that when the cover 330 is attached to the moisture-impermeable substrate 320, the seal 340 is compressed therebetween, which aids in enhancing a hermeticity of the seal 340. In other examples, the seal 340 may comprise a welded seal or a soldered seal. In the case of a metal-to-glass or metal-to-ceramic seal, the glass or ceramic may be bonded to a metal oxide layer during the sealing process. As described above, the moisture-impermeable substrate 320 may include a monolithic dielectric portion composed of glass, ceramic, and the like. As shown in FIG. 5A, the substrate may further comprise electrical connectors 350 and vias 450 and 454 coupled to a surface of the moisture-impermeable substrate, which may form a non-monolithic portion of the moisture-impermeable substrate 320 and may be impregnated into the dielectric monolithic portion.

The plurality of conductive vias 450 and 454 may further be impregnated into a dielectric monolithic portion of the substrate. Furthermore, a dielectric non-monolithic conductive portion comprising the plurality of conductive vias 450 and 454 may be integrated with a monolithic dielectric portion of the moisture-impermeable substrate 320. Vias 454 may be positioned within a portion of the moisture-impermeable substrate that is covered by the array of CMOS tiles 310 and/or the scintillator 315. As such vias 454 may be electrically connected to the array of CMOS tiles 310 precluding the need for additional electrical connectors thereat. Furthermore, a covered sealed region of the x-ray detector 502 may be reduced, which can aid in increasing a hermeticity of the covered sealed region.

As described above, and as shown in FIG. 5A, one or more of the vias 450 and 454 may span a thickness of the moisture-impermeable substrate 320. In other examples, one or more of the vias 450 and 454 may partially span a thickness of the moisture-impermeable substrate 320. Some of the plurality of vias 450 and 454 may be conductively coupled with additional electrical connectors 350, such as conductive traces, as shown in FIG. 5A. Some of the plurality of vias 450 may be conductively coupled to additional electronic devices positioned on the moisture-impermeable substrate behind the seal 340 and inside the covered sealed region, while other of the plurality of vias may be conductively coupled to additional electronic devices positioned on the moisture-impermeable substrate external to the seal 340 and outside the covered sealed region. In some cases, electrical connectors 350 may conductively couple vias 454 positioned on the moisture-impermeable substrate behind the seal 340 and inside the covered sealed region with vias 450 positioned on the moisture-impermeable substrate external to the seal 340 and outside the covered sealed region, as shown in FIG. 5A. In other cases, electrical connectors 350 may conductively couple vias 454 positioned on the moisture-impermeable substrate behind the seal 340 and inside the covered sealed region with other vias 454 positioned inside the covered sealed region, or electrical connectors 350 may conductively couple vias 450 positioned on the moisture-impermeable substrate external to the seal 340 and outside the covered sealed region with other vias 450 positioned outside the covered sealed region.

The electrical connectors 350 may comprise a plurality of conductive traces integrated into a surface layer of the moisture-impermeable substrate 320. The conductive traces may be conductively coupled to electrical components internal to the seal through additional electrical connectors such as vias 454, wire bonds, or other types of electrical connectors such as ACF bonds. As shown for x-ray detector 502, the analog-to-digital electronics 360 may be positioned external to the seal 340 and may be conductively coupled to the array of CMOS tiles 310 through vias 450 and 454 and (conductive traces) electrical connectors 350. Accordingly, signals from the array of CMOS tiles may be transmitted across the seal 340 to the analog-to-digital electronics 360 by way of the electrical connectors 350, and vias 454. As shown in FIG. 5A, electrical connectors may be routed across the seal 340, including through the moisture-impermeable substrate 320 by way the vias 454, and from the active region to the edge region by way of the conductive trace electrical connector 350. As such, the electrical connectors 350 can supply power into the devices inside the covered sealed region and can transmit signals from within the covered sealed region externally to the seal 340 without compromising a hermeticity of the seal 340. Furthermore, by utilizing vias to route signals across the thickness of the moisture-impermeable substrate, rather than underneath or through the seal 340, a hermeticity of the seal 340 may be more reliably preserved.

Figure 6A:
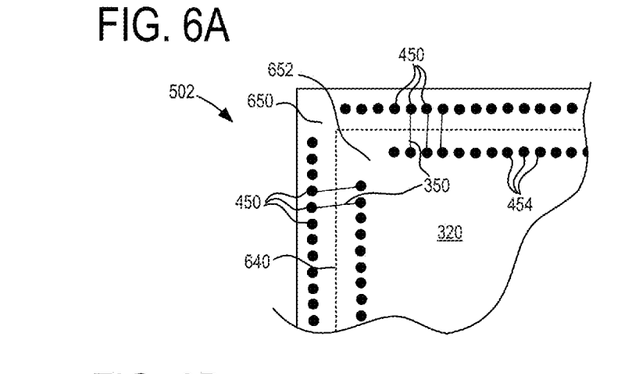
FIGS. 6A and 6B are schematics showing partial worm's eye views of multiply-tiled CMOS x-ray detectors of FIGS. 5A and 5B, respectively.

Turning now to FIG. 6A, it illustrates a partial worm's eye view of x-ray detector 502 described above with respect to FIG. 5A, including the moisture-impermeable substrate 320. Dashed line 640 indicates a perimeter position of the seal 340 on an opposite surface of the moisture-impermeable substrate 320 on which the array of CMOS tiles are arranged. Vias 454 are positioned interiorly within in the moisture-impermeable substrate 320 relative to the seal 340 (indicated by 640), while vias 450 are positioned exteriorly within in the moisture-impermeable substrate 320 relative to the seal 340. Furthermore, vias 454 may be conductively coupled to vias 450 with electrical connectors 350, such as conductive traces, on the surface of the moisture-impermeable substrate 320 opposite from the covered sealed region. As such, power and signals may be transmitted into and out of the covered sealed region by way of vias 450 and 454 and electrical connectors 350. Patterning or arrangement of the plurality of vias 450 may include linear arrays of vias positioned along a perimeter of the moisture-impermeable substrate 320. Similarly, the plurality of vias 454 may be arranged as linear arrays of vias positioned along an interior perimeter of the seal 340 (as indicate by 640) within the moisture-impermeable substrate 320. Corner regions 650 and 652 exterior and interior to the perimeter of the seal 340 respectively, may be left devoid of vias or other electrical connectors 350 to simplify fabrication of the x-ray detector.

Figure 5B:
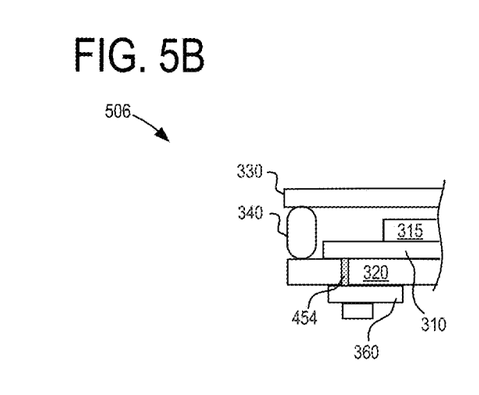

Turning now to FIG. 5B, it illustrates a partial cross-sectional view of an embodiment of a sealed x-ray detector 506 including an array of CMOS tiles 310 positioned between a scintillator 315 and a moisture-impermeable substrate 320. A cover 330 is positioned on top of the moisture-impermeable substrate 320 thereby forming a seal 340 and sealing the array of CMOS tiles 310 and the scintillator 315 therebetween. In the embodiment of FIG. 5B, the seal 340 may comprise an epoxy seal or another polymeric, elastomeric seal that is elastically compressible and deformable so that when the cover 330 is attached to the moisture-impermeable substrate 320, the seal 340 is compressed therebetween, which aids in enhancing a hermeticity of the seal 340. In other examples, the seal 340 may comprise a welded seal or a soldered seal. In the case of a metal-to-glass or metal-to-ceramic seal, the glass or ceramic may be bonded to a metal oxide layer during the sealing process. As described above, the moisture-impermeable substrate 320 may include a monolithic dielectric portion composed of glass, ceramic, and the like. As shown in FIG. 5B, the substrate may further comprise electrical connectors 350 and vias 454 coupled to a surface of the moisture-impermeable substrate, which may form a non-monolithic portion of the moisture-impermeable substrate 320 and may be impregnated into the dielectric monolithic portion.

The plurality of conductive vias 454 may further be impregnated into a dielectric monolithic portion of the substrate. Furthermore, a dielectric non-monolithic conductive portion comprising the plurality of conductive vias 454 may be integrated with a monolithic dielectric portion of the moisture-impermeable substrate 320. Vias 454 may be positioned within a portion of the moisture-impermeable substrate that is covered by the array of CMOS tiles 310 and/or the scintillator 315. As such vias 454 may be electrically connected to the array of CMOS tiles 310 precluding the need for additional electrical connectors thereat. Furthermore, a covered sealed region of the x-ray detector 502 may be reduced, which can aid in increasing a hermeticity of the covered sealed region.

As described above, and as shown in FIG. 5B, one or more of the vias 450 and 454 may span a thickness of the moisture-impermeable substrate 320. In other examples, one or more of the vias 454 may partially span a thickness of the moisture-impermeable substrate 320. Some of the plurality of vias 454 may be conductively coupled with additional electrical connectors 350, such as conductive traces, wire bonds, and ACF bonds. Some of the plurality of vias 454 may be conductively coupled to additional electronic devices positioned on the moisture-impermeable substrate external to the covered sealed region. For the x-ray detector 506, the analog-to-digital electronics 360 are positioned on the surface of the moisture-impermeable substrate 320 opposite the array of CMOS tiles 310 and external to the covered sealed region. As such, vias 454 may directly couple the analog-to-digital electronics 360 to the array of CMOS tiles 310, without additional electrical connectors 350. Furthermore, the edge to active region ratio can be reduced, thereby decreasing a size and increasing a portability of the x-ray detector 506. Further still, positioning vias in the moisture-impermeable substrate under CMOS tiles can facilitate transmission of power and signals to and from four-side buttable CMOS tiles within larger arrays of CMOS tiles. For example, other electronic components positioned externally to the covered sealed region such as power sources, sensors, and the like may also be coupled to the array of CMOS tiles 310 or other electronic components positioned within the covered sealed region across the moisture-impermeable substrate 320 in this fashion.

The electrical connectors 350 may comprise a plurality of conductive traces integrated into a surface layer of the moisture-impermeable substrate 320. The conductive traces may be conductively coupled to electrical components internal to the seal through additional electrical connectors such as vias 454, wire bonds, or other types of electrical connectors such as ACF bonds. As shown for x-ray detector 506, the analog-to-digital electronics 360 may be positioned external to the seal 340 and may be conductively coupled to the array of CMOS tiles 310 through vias 454. Accordingly, signals from the array of CMOS tiles may be transmitted across the seal 340 to the analog-to-digital electronics 360 by way of the vias 454. Utilizing vias to route signals across the thickness of the moisture-impermeable substrate, rather than underneath or through the seal 340, may more reliably preserve a hermeticity of the seal 340.

Figure 7A:
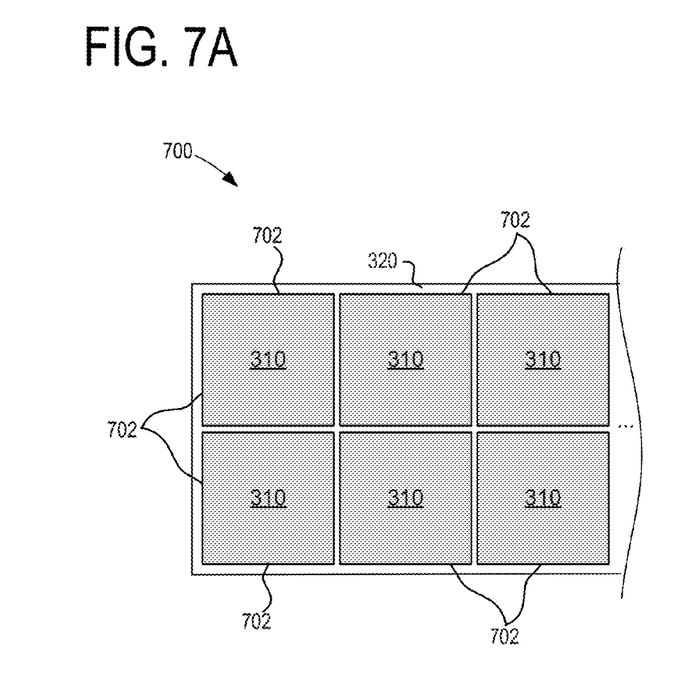
FIGS. 7A and 7B are schematics showing partial aerial views of arrays of CMOS tiles arranged on a substrate.
Figure 7B:
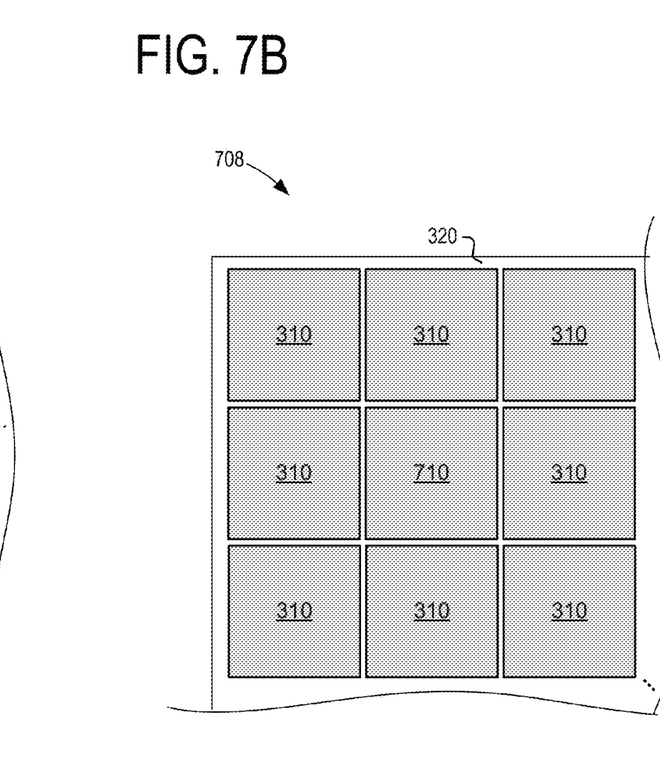

Furthermore, coupling the analog-to-digital electronics 360 positioned on an opposite surface of the moisture-impermeable substrate 320 to the array of CMOS tiles 310 through vias 454, facilitates supply and transmission of power and signals to and from four-side buttable CMOS tiles 710 (as shown in FIG. 7B), which can be found in 3×3 and larger arrays of CMOS tiles. Because four-side buttable CMOS tiles 710 are surrounded on all four sides by adjacent CMOS tiles, supplying and transmitting power and signals to and from four-side buttable CMOS tiles 710 through vias 454 underneath the CMOS tiles directs electrical connectors (wire bonds, vias, ACF bonds, conductive traces, and the like) away from the adjacent four-side butting CMOS tiles.

Figure 6B:
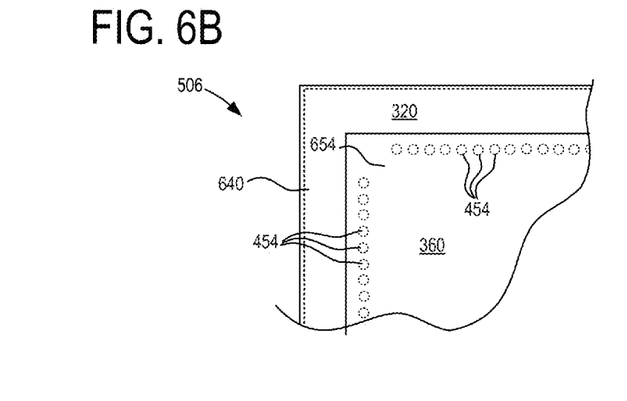

Turning now to FIG. 6B, it illustrates a partial worm's eye view of x-ray detector 506, including the moisture-impermeable substrate 320. Dashed line 640 indicates a perimeter position of the seal 340 on an opposite surface of the moisture-impermeable substrate 320. Vias 454 are positioned interiorly within in the moisture-impermeable substrate 320 relative to the seal 340 (indicated by 640), and are indicated by dashed lines since they are covered by the analog-to-digital electronics 360 positioned on an underside of the x-ray detector 506, as shown in FIG. 5B. As such, power and signals may be transmitted into and out of the covered sealed region by way of vias 454 to the analog-to-digital electronics 360 without additional electrical connectors 350. Furthermore, in the case of four-side buttable CMOS tiles, power and signals may be transmitted into and out of the covered sealed region away from adjacent four-side butting CMOS tiles. Although not shown in FIG. 6B, x-ray detector 405 may comprise additional electrical connectors 350 for coupling external power sources, computer processors, and the like to the analog-to-digital electronics.

Patterning or arrangement of the plurality of vias 454 may include linear arrays of vias positioned within the moisture-impermeable substrate 320 along a perimeter of the analog-to-digital electronics, which may be aligned with the perimeter of the array of CMOS tiles (as shown in FIG. 5B). Corner regions 654 interior to the perimeter of the seal 340 respectively, may be left devoid of vias or other electrical connectors 350 to simplify fabrication of the x-ray detector. A spacing of the array of vias 454 may correspond to a spacing of the output connections from the array of CMOS tiles and/or a spacing of the input connections to the analog-to-digital electronics 360.

Turning now to FIGS. 7A and 7B, they illustrate partial aerial views a 2×N (2 rows by N columns) array of CMOS tiles 700 and a N×N (N rows by N columns, N≥3) array of CMOS tiles 708. The CMOS tiles in the 2×N array of CMOS tiles 710 all include CMOS tiles 310 having exposed, exterior tile edges 702 in the array. As such various configurations of electrical connectors (conductive traces, vias, wire bonds, ACF bonds, and the like) as shown in FIGS. 3B, 4A-4D, 5A, and 5B may be utilized to supply and transmit power and signals to and from the array of CMOS tiles 310. In contrast, interior, four-side buttable CMOS tiles 710 within the N×N array of CMOS tiles 708 do not have exposed, exterior tile edges 702. As such, supply and transmission of power and signals to and from four-side buttable CMOS tiles 710 utilizing vias spanning a thickness of the moisture-impermeable substrate 320 and positioned underneath the four-side buttable CMOS tiles 710 (as shown in FIGS. 5B and 6B) may aid in simplifying the layout and design of the x-ray detector. Furthermore, by directing the supply and transmission of signals and power to and from four-side buttable CMOS tiles 710 away from adjacent four-side butting tiles, heat accumulation and degradation of the x-ray detector may be reduced. Supply and transmission of power and signals to and from four-side buttable CMOS tiles 710 utilizing vias spanning a thickness of the moisture-impermeable substrate 320 and positioned underneath the four-side buttable CMOS tiles 710 (as shown in FIGS. 5B and 6B) may also be utilized for arrays of CMOS tiles 310 that have exposed, exterior tile edges 702, although manufacturing costs may be increased.

Figure 8:
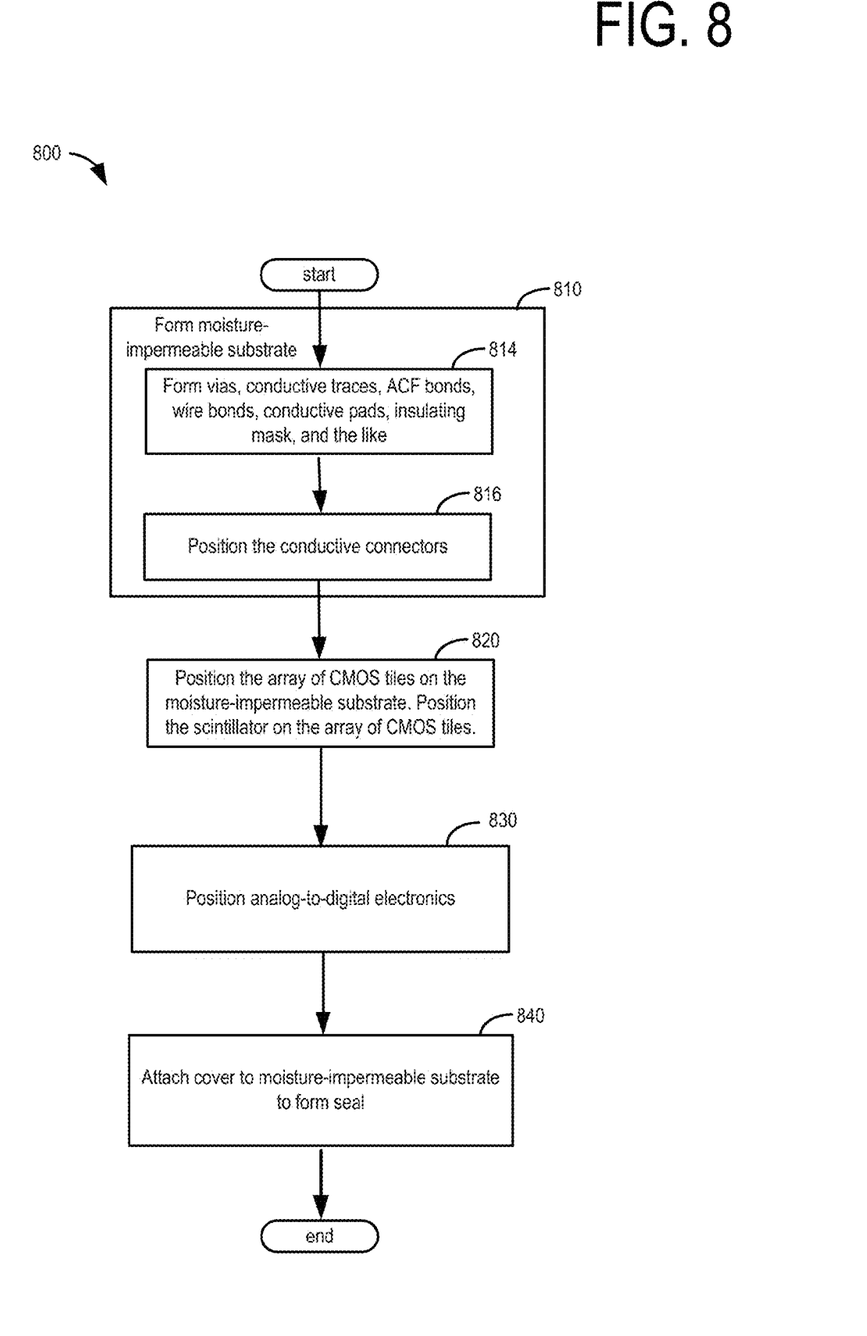
FIG. 8 is an example flow chart for a method of assembling the x-ray detectors of FIGS. 3A, 3B, 4A-4D, 5A, 5B, 6A, and 6B.

Turning now to FIG. 8, it illustrates a method 900 for assembling an x-ray detector. Method 800 begins at 810 by forming the moisture-impermeable substrate. As described above, the moisture-impermeable substrate may include a monolithic dielectric substrate such as glass, ceramic, and the like. Forming the moisture-impermeable substrate may include forming conductive electrical connectors at 814 such as vias, conductive traces, ACF bonds, wire bonds conductive pads, insulating masks, and the like, and described above with respect to FIGS. 3B, 4A-4D, 5A, and 5B. The conductive electrical connectors may be coupled to the moisture-impermeable substrate. In other examples, a plurality of the conductive electrical connectors may form a non-monolithic conductive portion of the moisture-impermeable substrate. As such, the monolithic dielectric portion of the moisture-impermeable substrate may be impregnated with the conductive electrical connectors.

For example: one or more conductive traces may be positioned or inlaid at a surface or subsurface of the moisture-impermeable substrate; one or more vias may be formed through and spanning a partial or entire thickness of the substrate; one or more conductive pads or ACF bonds may be formed between an electrical component and a conductive trace (or the surface of the moisture-impermeable substrate); one or more wire bonds may be formed between electrical components or between an electrical component and a surface of the moisture-impermeable substrate; and one or more insulating masks may be formed over one or more conductive traces and underneath a seal 340. Forming the conductive electrical connectors may also comprise positioning the conductive electrical connectors 816 on or through the moisture-impermeable substrate, between electrical components, between a seal and the moisture-impermeable substrate, and between electrical components and the moisture-impermeable substrate.

Method 800 continues at 820 where the array of CMOS tiles may be positioned on the moisture-impermeable substrate, and the scintillator may be positioned on the array of CMOS tiles. As such, the array of CMOS tiles is sandwiched in between the scintillator and the moisture-impermeable substrate. The array of CMOS tiles may include one or more four-side buttable CMOS tiles, in addition to CMOS tiles having exposed exterior edges, as described above with respect to FIGS. 7A and 7B. In one example, four-side buttable CMOS tiles may be conductively coupled to vias and electrical components such as analog-to-digital electronics positioned underneath and on an opposite surface of the moisture-impermeable substrate, respectively, as illustrated in FIGS. 5B and 6B. Positioning the array of CMOS tiles may also include conductively coupling the array of CMOS tiles to the scintillator and to electrical connectors for supplying and transmitting power and signals to and from the covered sealed region without disrupting a hermeticity of the seal. Next, method 800 continues at 830 where the analog-to-digital electronics may be positioned on the moisture-impermeable substrate. The analog-to-digital electronics may be positioned within a covered sealed region, as shown in FIGS. 3B, and 4A-4C, or may be positioned external to the seal and the covered sealed region, as shown in FIGS. 4D, 5A, and 5B. Positioning the analog-to-digital electronics external to the seal and the covered sealed region may aid in reducing an edge to active area of the x-ray detector, and may aid in increasing heat dissipation within the x-ray detector. Positioning the analog-to-digital electronics may further include conductively coupling the array of CMOS tiles to conductive electrical connectors for supplying and transmitting power and signals to and from the covered sealed region without disrupting a hermeticity of the seal.

Method 800 continues at 840 where the cover is attached to the moisture-impermeable substrate, thereby forming a seal. As such, the scintillator and the array of CMOS tiles are enclosed within a covered sealed region formed by the cover, the moisture-impermeable substrate, and the seal. After 840, method 800 ends.

As provided above, scintillator sealing for solid state CMOS x-ray detectors is shown and described. In one embodiment, an x-ray detector includes a moisture-impermeable substrate including a non-monolithic conductive portion integrated with a monolithic dielectric portion. The x-ray detector may further include a scintillator, and an array of CMOS tiles may positioned between the scintillator and the moisture-impermeable substrate. Additionally, a cover may be positioned on the moisture-impermeable substrate and may form a seal therebetween that semi-hermetically encloses the scintillator and the array of CMOS tiles in a covered sealed region, and analog-to-digital electronics conductively coupled to the array of CMOS tiles and to the conductive portion.

In one example, the conductive portion transmits signals from the covered sealed region to beyond the seal without disrupting a semi-hermeticity of the seal. In another example, the conductive portion includes a plurality of vias spanning a thickness of the monolithic dielectric portion. Furthermore, the conductive portion may include a plurality of conductive traces positioned at a substrate surface outside of the covered sealed region. In another example, the plurality of vias include vias positioned in the substrate within a perimeter of the array of CMOS tiles and vias positioned in the substrate beyond a perimeter of the array of CMOS tiles. Furthermore, the analog-to-digital electronics may be positioned internal to the covered sealed region and conductively coupled to the plurality of vias. Further still, the analog-to-digital electronics are positioned external to the covered sealed region, and conductively coupled to the array of CMOS tiles by the plurality of vias.

In other examples, the plurality of vias are positioned in the moisture-impermeable substrate within a perimeter of the array of CMOS tiles. The array of CMOS tiles may comprise a four-side buttable CMOS tile. Furthermore, the analog-to-digital electronics may be positioned outside of the covered sealed region at an opposing surface of the moisture-impermeable substrate from the four-side buttable CMOS tile, and conductively coupled to the four-side buttable CMOS tile by the plurality of vias.

In another embodiment, an x-ray detector may include a monolithic substrate comprising a moisture-impermeable and dielectric material, a scintillator, a cover, and a plurality of CMOS tiles. The plurality of CMOS tiles may be positioned between the scintillator and the monolithic substrate, and the cover may be positioned on the monolithic substrate, forming a seal therebetween that semi-hermetically seals the scintillator and the plurality of CMOS tiles between the cover and the monolithic substrate. Additionally, a plurality of conductive connectors may be coupled to the monolithic substrate, the conductive connectors transmitting signals from the array of CMOS tiles external to the seal without disrupting a semi-hermeticity of the seal.

The monolithic substrate include one of glass and ceramic, the seal may include one of solder and a weld, and the x-ray detector may further include an insulating mask positioned between the seal and the monolithic substrate. In one example, the x-ray detector may include analog-to-digital electronics positioned external to the seal, and the plurality of conductive connectors can include an anisotropic conductor film bond between the analog-to-digital electronics and the monolithic substrate. Moreover, the plurality of conductive connectors may include one or more vias through a thickness of the monolithic substrate. Furthermore, the seal may include one or a combination of a glass-to-glass semi-hermetic seal and a glass-to-ceramic semi-hermetic seal.

In another embodiment, a method of assembling an x-ray detector may comprise forming a moisture-impermeable substrate by impregnating a monolithic dielectric material with a plurality of non-monolithic conductive structures. Furthermore, the method can include positioning an array of CMOS tiles between a scintillator and the moisture-impermeable substrate, and attaching a cover to the moisture-impermeable substrate, thereby forming a seal that semi-hermetically seals the scintillator and the array of CMOS tiles therebetween. Additionally signals may be transmitted from the array of CMOS tiles external to the seal through the plurality of non-monolithic conductive structures without disrupting a semi-hermeticity of the seal.

In one example, impregnating the monolithic dielectric material with the plurality of non-monolithic conductive structures can include forming a plurality of conductive traces in the substrate. Furthermore, each of the plurality of conductive traces can extend across the seal, and may further include conductively coupling analog-to-digital electronics to one or more of the conductive traces through an ACF bond, and the array of CMOS tiles through one or more wire bonds. Further still, impregnating the monolithic dielectric material with the plurality of non-monolithic conductive structures may include forming a plurality of vias spanning a thickness of the moisture-impermeable substrate, each of the vias conductively coupled to one or more of the conductive traces. Further still, forming the seal that semi-hermetically seals the scintillator and the array of CMOS tiles therebetween may include semi-hermetically attaching an insulating mask to the moisture-impermeable substrate and forming the seal between the insulating mask and the cover.

In this way, a technical effect of sealing of multiply-tiled CMOS image array detectors within a single x-ray detector can be more simply and reliably achieved. Furthermore, electrical connectors are provided for supplying power to or transmitting signals from the CMOS tiles across the seal without compromising the semi-hermeticity of the seal. Further still, x-ray detectors comprising four-side buttable CMOS tiles can be more simply and reliably sealed. Further still, the edge to active area of the x-ray detector can be reduced, thereby decreasing material costs for manufacturing the x-ray detector and the weight of the x-ray detector.

It is to be understood that the description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to those of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

Additionally, the term pixel is used throughout the specification and should be interpreted to include one or more pixel. The term pixel is not restricted by any number because of the use of singular or multiple forms.

This written description uses examples to disclose several embodiments of the inventive subject matter and also to enable any person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described systems and methods, without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

The invention claimed is:

1. An x-ray detector, comprising:
   a moisture-impermeable substrate including a non-monolithic conductive portion integrated with a monolithic dielectric portion, wherein the non-monolithic conductive portion is impregnated in the monolithic dielectric portion;
   a scintillator and an array of CMOS tiles positioned between the scintillator and the substrate;
   a cover positioned on the substrate and forming a seal therebetween that semi-hermetically encloses the scintillator and the array of CMOS tiles in a covered sealed region; and
   analog-to-digital electronics conductively coupled to the array of CMOS tiles and to the conductive portion, wherein the conductive portion transmits signals from the covered sealed region to beyond the seal without disrupting the semi-hermeticity of the seal.

2. The x-ray detector of claim 1, wherein the conductive portion comprises a plurality of vias spanning a thickness of the monolithic dielectric portion.

3. The x-ray detector of claim 2, wherein the conductive portion further comprises a plurality of conductive traces positioned at a substrate surface outside of the covered sealed region.

4. The x-ray detector of claim 3, wherein the plurality of vias includes vias positioned in the substrate within a perimeter of the array of CMOS tiles and vias positioned in the substrate beyond the perimeter of the array of CMOS tiles.

5. The x-ray detector of claim 4, wherein the analog-to-digital electronics are positioned internal to the covered sealed region, and conductively coupled to the plurality of vias.

6. The x-ray detector of claim 4, wherein the analog-to-digital electronics are positioned external to the covered sealed region, and conductively coupled to the array of CMOS tiles by the plurality of vias.

7. The x-ray detector of claim 2, wherein the plurality of vias is positioned in the substrate within a perimeter of the array of CMOS tiles.

8. The x-ray detector of claim 7, wherein the array of CMOS tiles comprises a four-side buttable CMOS tile.

9. The x-ray detector of claim 8, wherein the analog-to-digital electronics are positioned outside of the covered sealed region at an opposing surface of the substrate from the four-side buttable CMOS tile, and conductively coupled to the four-side buttable CMOS tile by the plurality of vias.

10. An x-ray detector, comprising:
a monolithic substrate comprising a moisture-impermeable and dielectric material;
a scintillator and a plurality of CMOS tiles, the plurality of CMOS tiles positioned between the scintillator and the monolithic substrate;
a cover positioned on the monolithic substrate and forming a seal therebetween that semi-hermetically seals the scintillator and the plurality of CMOS tiles between the cover and the monolithic substrate; and
a plurality of conductive connectors coupled to the monolithic substrate, the conductive connectors transmitting signals from the array of CMOS tiles external to the seal without disrupting the semi-hermeticity of the seal.

11. The x-ray detector of claim 10, wherein the monolithic substrate comprises one of glass and ceramic.

12. The x-ray detector of claim 11, wherein the seal comprises one of solder and a weld.

13. The x-ray detector of claim 12, wherein the x-ray detector further comprises an insulating mask positioned between the seal and the monolithic substrate.

14. The x-ray detector of claim 13, further comprising analog-to-digital electronics positioned external to the seal, and wherein the plurality of conductive connectors comprise an anisotropic conductor film bond between the analog-to-digital electronics and the monolithic substrate.

15. The x-ray detector of claim 14, wherein the plurality of conductive connectors comprises one or more vias through a thickness of the monolithic substrate.

16. The x-ray detector of claim 11, wherein the seal comprises one or a combination of a glass-to-glass semi-hermetic seal and a glass-to-ceramic semi-hermetic seal.

17. A method of assembling an x-ray detector, comprising:
forming a moisture-impermeable substrate by impregnating a monolithic dielectric material with a plurality of non-monolithic conductive structures;
positioning an array of CMOS tiles between a scintillator and the moisture-impermeable substrate;
attaching a cover to the moisture-impermeable substrate, thereby forming a seal that semi-hermetically seals the scintillator and the array of CMOS tiles therebetween; and
transmitting signals from the array of CMOS tiles external to the seal through the plurality of non-monolithic conductive structures without disrupting the semi-hermeticity of the seal.

18. The method of claim 17, wherein impregnating the monolithic dielectric material with the plurality of non-monolithic conductive structures comprises forming a plurality of conductive traces in the moisture-impermeable substrate, each of the plurality of conductive traces extending across the seal, and
further comprising conductively coupling analog-to-digital electronics to one or more of the conductive traces through an ACF bond, and conductively coupling the array of CMOS tiles through one or more wire bonds.

19. The method of claim 18, wherein impregnating the monolithic dielectric material with the plurality of non-monolithic conductive structures further comprises forming a plurality of vias spanning a thickness of the moisture-impermeable substrate, each of the vias conductively coupled to one or more of the conductive traces.

20. The method of claim 19, wherein forming the seal that semi-hermetically seals the scintillator and the array of CMOS tiles therebetween comprises semi-hermetically attaching an insulating mask to the moisture-impermeable substrate and forming the seal between the insulating mask and the cover.

* * * * *